US008416824B2

(12) United States Patent
Takeuchi et al.

(10) Patent No.: US 8,416,824 B2
(45) Date of Patent: Apr. 9, 2013

(54) SURFACE EMITTING LASER WITH CURRENT CONSTRICTION LAYER AND MULTIPLE ACTIVE REGIONS

(75) Inventors: Tetsuya Takeuchi, Yokohama (JP); Yoshinobu Sekiguchi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/321,438

(22) PCT Filed: Jul. 2, 2010

(86) PCT No.: PCT/JP2010/061653

§ 371 (c)(1), (2), (4) Date: Nov. 18, 2011

(87) PCT Pub. No.: WO2011/013498

PCT Pub. Date: Feb. 3, 2011

(65) Prior Publication Data

US 2012/0076163 A1 Mar. 29, 2012

(30) Foreign Application Priority Data

Jul. 28, 2009 (JP) ................................ 2009-175352

(51) Int. Cl.
*H01S 5/00* (2006.01)

(52) U.S. Cl.
USPC ................. 372/45.01; 372/46.013; 372/46.01

(58) Field of Classification Search ............... 372/45.01, 372/46.013, 46.01
See application file for complete search history.

(56) References Cited

U.S. PATENT DOCUMENTS 5,157,680 A * 10/1992 Goto ........................... 372/50.1
5,343,487 A 8/1994 Scott et al.
(Continued)

FOREIGN PATENT DOCUMENTS

EP 0712182 A2 5/1996
EP 1081816 A2 3/2001
(Continued)

OTHER PUBLICATIONS

AJ Fischer et al., "Bistable Output from a Coupled-Resonator Vertical-Cavity Laser Diode", Applied Physics Letters, American Institute of Physics, Melville, NY, US-LNKD-D0I: 10.1063/1.1326840, vol. 77, No. 21, pp. 3319-3321 (XP012026687) Published Nov. 20, 2000.

(Continued)

*Primary Examiner* — Kinam Park

(74) *Attorney, Agent, or Firm* — Fitzpatrick, Cella, Harper & Scinto

(57) ABSTRACT

A surface emitting laser is provided which can control a beam shape and can provide higher efficiency and higher power. The surface emitting laser includes a gain region that is provided between a first semiconductor multilayer film reflection mirror and a second semiconductor multilayer film reflection mirror, which are arranged so as to oppose to each other, and that has a first active layer and a second active layer. The surface emitting laser has a current constriction layer for constricting an electric current which is injected into the first active layer and the second active layer. The first active layer and the second active layer have different active layer structures from each other.

5 Claims, 7 Drawing Sheets

120
118
116
114
112
110
108
106
104
102

U.S. PATENT DOCUMENTS

| | | | | |
|---|---|---|---|---|
| 5,812,577 | A * | 9/1998 | Dawson et al. | 372/46.015 |
| 6,567,454 | B1 | 5/2003 | Fischer et al. | |
| 7,609,745 | B2 | 10/2009 | Takeuchi | 372/99 |
| 7,768,021 | B2 | 8/2010 | Takeuchi | 257/93 |
| 7,796,662 | B2 | 9/2010 | Uchida et al. | 372/46.013 |
| 7,813,402 | B2 | 10/2010 | Sekiguchi | 372/46.01 |
| 7,830,944 | B2 | 11/2010 | Takeuchi et al. | 372/99 |
| 7,839,913 | B2 | 11/2010 | Uchida et al. | 372/50.124 |
| 7,924,900 | B2 | 4/2011 | Takeuchi | 372/50.124 |
| 8,116,345 | B2 | 2/2012 | Takeuchi | 372/50.124 |
| 2001/0043629 | A1* | 11/2001 | Sun et al. | 372/43 |
| 2006/0104326 | A1* | 5/2006 | Kim | 372/43.01 |
| 2012/0033699 | A1 | 2/2012 | Sekiguchi | 372/45.012 |

FOREIGN PATENT DOCUMENTS

| | | | |
|---|---|---|---|
| EP | 1648060 | A1 | 4/2006 |
| JP | 2004227860 | A | 8/2004 |
| JP | 2001094209 | A | 4/2011 |
| WO | 01/63708 | A2 | 8/2001 |

OTHER PUBLICATIONS

T Knoedl et al., "Bistability in Bipolar Cascade VCSELs", Electronics Letters, IEE Stevenage, GB LNKD-DOI: 10.1049/EL:2002 02 vol. 38, No. 8, pp. 370-371 (XP006018183) Published Apr. 11, 2002.

* cited by examiner

SURFACE EMITTING LASER WITH CURRENT CONSTRICTION LAYER AND MULTIPLE ACTIVE REGIONS

TECHNICAL FIELD

The present invention relates to a surface emitting laser device, and particularly relates to a surface emitting laser having a current constriction layer and a plurality of active layers.

BACKGROUND ART

While a surface emitting laser device (in particular, a vertical resonator type surface emitting laser is referred to as a VCSEL) can emit a laser beam in a direction perpendicular to the thickness direction of a semiconductor substrate, the device is also recognized to be comparatively easier to be two-dimensionally arrayed.

When the surface emitting laser devices are two-dimensionally arrayed, a parallel processing is enabled by multiple beams to be emitted and, various industrial applications are expected with the view of increasing the density and the speed. When the surface emitting laser array is used as, for instance, an exposure light source of an electrophotographic printer, the printing speed can be increased by the parallel processing of a printing process with use of the multiple beams. In such a printing process of the electrophotography, the quantity of light necessary for exposing a photosensitive drum to light is needed, while at the same time a stable and fine laser spot is necessary to be formed on a photosensitive drum.

Accordingly, the laser beam is required to have both amount and quality, which are respectively such a high-power operation as to satisfy the necessary quantity of light and a single transverse mode operation in a single-peak beam shape.

In the surface emitting laser, an active layer generally has an extremely thin thickness (0.1 μm or less) compared to that of a resonator length (approximately 1 to 2 μm), so that structurally a high-power operation cannot be obtained. Then, a structure that a plurality of active layers are arranged in the resonator, for instance, a periodic gain structure (PGS) in which the active layers are periodically arranged in the antinodes of a standing wave, is adopted as needed.

Thereby, a confinement factor increases, and the output is estimated to increase.

However, in this PGS structure, an i layer in a p-i-n junction theoretically becomes thick. Furthermore, the mobility of a positive hole is smaller than that of an electron. From the reasons, the distribution of the electron and the positive hole is formed in a lengthwise direction of the i layer, and the obtained effect has not reached an expected level.

From the above reasons, a method as in Japanese Patent Application Laid-Open No. 2001-94209 (the 8th page, FIG. 2) is proposed, which can equally inject carriers to each of the active layers even when a plurality of active layers exist as in the periodic gain structure, by forming a pn junction in an in-plane direction.

In addition, a surface emitting laser which can provide high efficiency and high power by forming a current constriction structure and injecting an electric current into a focused necessary region is achieved. In this method, an AlGaAs layer having a high-Al composition, for instance, a composition of 98% Al, is provided in a multilayer film reflection mirror. Then, the AlGaAs layer is selectively oxidized in a high-temperature water vapor atmosphere to form the current constriction structure having a diameter of an aperture, for instance, of 10 μm or less so that the electric current can be efficiently injected only into the necessary region.

DISCLOSURE OF THE INVENTION

Although, a surface emitting laser of a conventional example having the above described current constriction structure therein is acceptable from the viewpoint of the high efficiency and high power, it is not necessarily preferred from the viewpoint of a transverse mode control for controlling a beam shape.

When attention is paid to a career distribution in the in-plane direction, the electric current further concentrates in the end of the aperture of the current constriction structure, and the electric current density tends to easily form a concave shape in the aperture part and the active layer.

Here, when a single-peak beam is needed, that is, a convex shape of a light distribution shape is needed, a coupling efficiency of the concave electric current density distribution with the convex light distribution is poor.

For this reason, there is a problem that a gain (contribution of electric current) to a zero order optical mode which achieves the single-peak beam is low in the effectiveness, and the light output results in being limited.

In view of the above described problems, an object of the present invention is to provide a surface emitting laser which can control a beam shape and can provide higher efficiency and a higher power.

With the present invention it is achieved that the surface emitting laser can control a beam shape and can provide the high efficiency and high power.

Further features of the present invention will become apparent from the following description of exemplary embodiments with reference to the attached drawings.

BEST MODES FOR CARRYING OUT THE INVENTION

A surface emitting laser in the present embodiment of the present invention will be described below, which includes a gain region having a plurality of active layers and a current constriction layer for constricting an electric current between a first semiconductor multilayer film reflection mirror and a second semiconductor multilayer film reflection mirror which are arranged so as to oppose to each other.

The present inventors made an extensive investigation on achieving high efficiency and high power in a surface emitting laser having a plurality of active layers therein, and as a result, have found that the surface emitting laser can achieve the high efficiency and high power, by preparing a different active layer structure according to the difference of the electric current density distribution in the in-plane direction of the active layer that is produced by the constriction of the electric current.

At this time, the following computation was conducted.

In the surface emitting laser which has the current constriction structure and further a plurality of the active layers as the gain region, the in-plane directional current density distribution in each of the active layers was computed. A surface emitting laser as illustrated in FIG. 2A and FIG. 2B was used as a structure for computation.

Figure 2A:
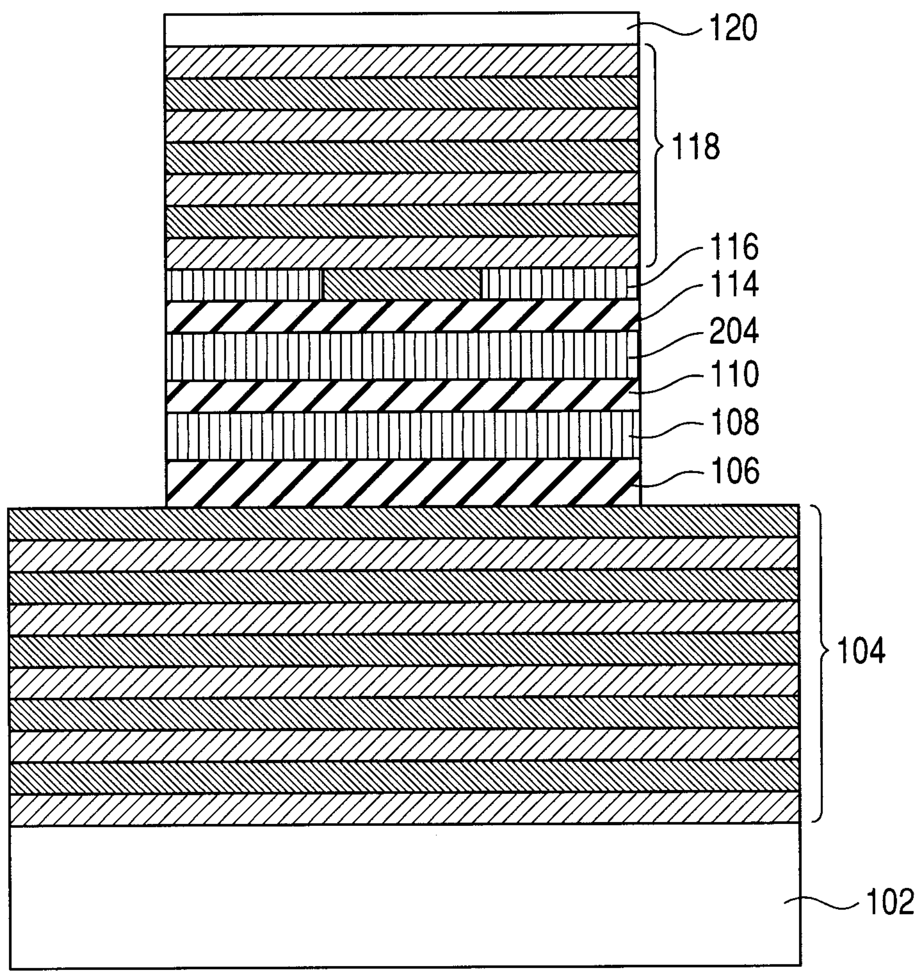
FIG. 2A is a view for describing a structure of a surface emitting laser having a plurality of active layers according to an exemplary embodiment of the present invention, which includes a conventional example.
Figure 2B:
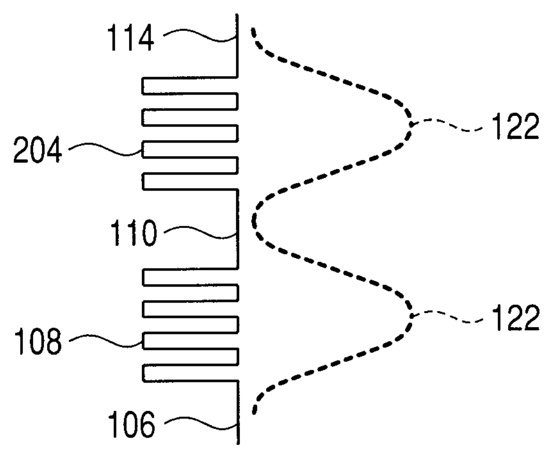
FIG. 2B is a view illustrating energy levels of conduction bands in the periphery of active layers in the surface emitting laser in FIG. 2A.

FIG. 2A illustrates the surface emitting laser which contains two multiple quantum well structures 108 and 204 between semiconductor multilayer film reflection mirrors 104 and 118 which also serve as a pn junction, and FIG. 2B illustrates that the two multiple quantum well structures 108 and 204 are respectively arranged in antinodes 122 of a light intensity distribution in the resonator, which is so-called a periodic gain structure. An oxidized constriction layer 116 is arranged in a multilayer film reflection mirror 118 formed of a p-type semiconductor layer, and an electric current is constricted there and is injected into the active layer.

An in-plane directional current density distribution was computed in the case of a conventional example in which the diameter of the aperture of the oxidized constriction layer was 6 μm in the structure illustrated in the FIG. 2, and a quadruple quantum well was used for multiplex quantum wells of both of the active layers.

Figure 3A:
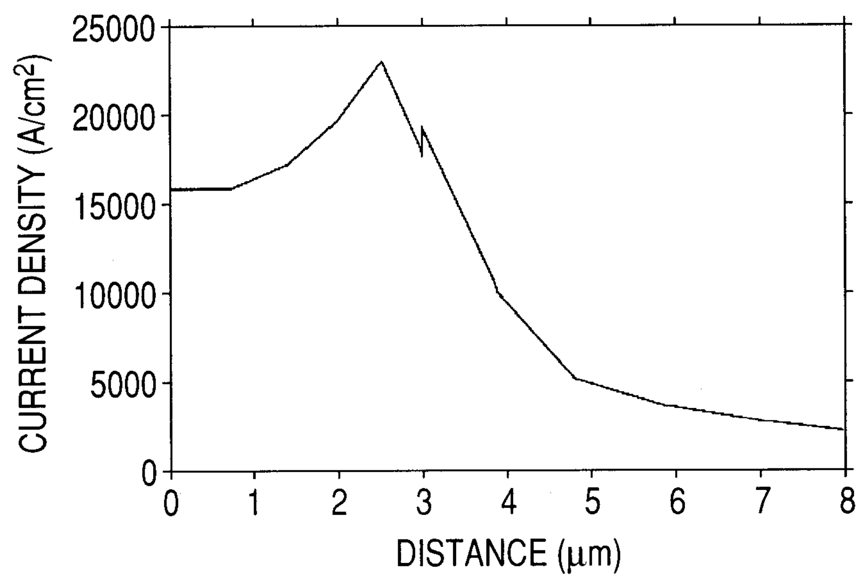
FIG. 3A and FIG. 3B are views for describing an electric current density distribution in each of active layers in a surface emitting laser having a plurality of active layers according to an exemplary embodiment of the present invention.
Figure 3B:
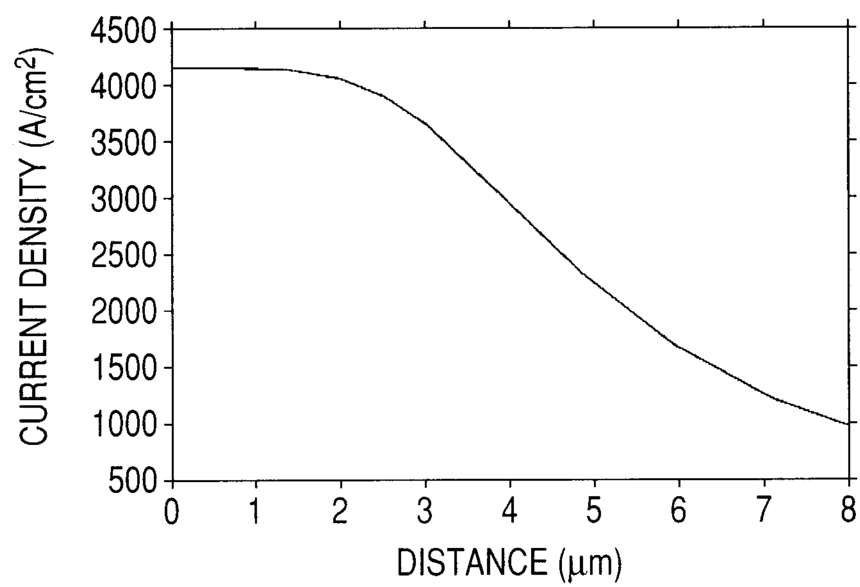

FIG. 3A illustrates an in-plane distribution of an electric current density in a first active layer 204 which is close to an oxidized constriction layer, and FIG. 3B illustrates an in-plane distribution of an electric current density in a second active layer 108 which is distant from the oxidized constriction layer.

An ordinate axis represents an electric current density ($A/cm^2$), and an abscissa axis represents a distance from the center of the diameter of the oxidized constriction layer. From this result, it was understood that when a plurality of active layers existed, an influence of the concentration of an electric current into the periphery (2 to 3 μm from the center) of the end of the current constriction aperture still remained in the first active layer 204 located close to the current constriction layer, and the electric current density distribution formed a concave shape.

On the other hand, it was understood that the influence of the concentration of the electric current into the end part was sufficiently weakened in the second active layer 108 located distant from the oxidized constriction layer, and the electric current density distribution formed a convex shape.

This is considered to be because an electric current consumption is large in the end part of the aperture of the oxidized constriction layer in the first active layer located close to the oxidized constriction layer, and accordingly the electric current consumption is relatively large in the central part of the aperture in the second active layer located distant from the oxidized constriction layer, in addition to the effect of the spread of the electric current.

Figure 4A:
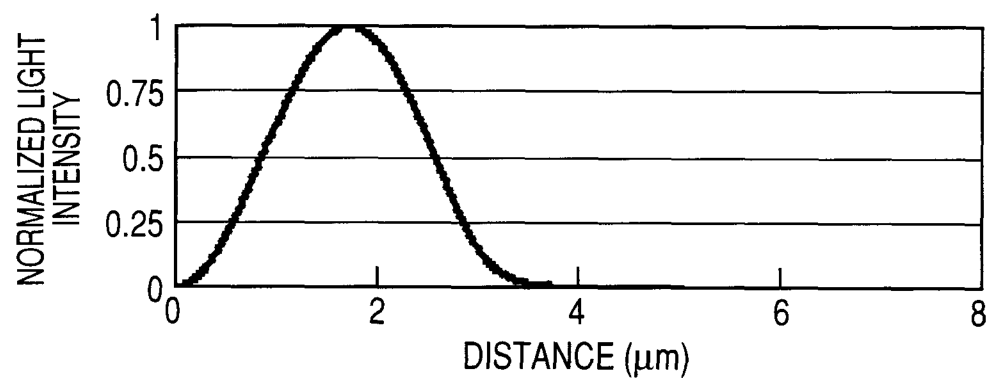
FIG. 4A is a view for describing a first-order optical mode distribution of a surface emitting laser according to an exemplary embodiment of the present invention.
Figure 4B:
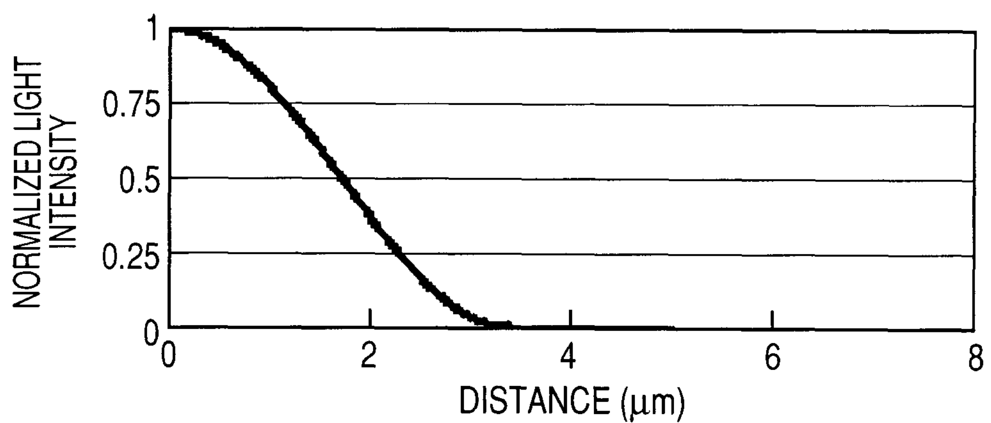
FIG. 4B is a view for describing a zero order optical mode distribution of a surface emitting laser according to an exemplary embodiment of the present invention.

Here, when a light mode is considered, the light distribution shows a concave shape in a first-order mode, as is illustrated in FIG. 4A, and shows a convex shape in a zero order mode, as is illustrated in FIG. 4B.

In FIGS. 4A and 4B, an ordinate axis represents a normalized light intensity, and an abscissa axis represents a distance from the center of the diameter of the oxidized constriction layer similarly to that in FIGS. 3A and 3B.

When a single mode operation in a zero order mode is intended to be obtained as an example, the shape of the zero order optical mode distribution is desired to be similar to that of the electric current density distribution, in other words, the distributions having high coupling efficiency with respect to each other are desired.

When the above described computation result is considered, the electric current density distribution (FIG. 3B) of the second active layer 108 which is distant from the oxidized constriction layer is strongly coupled to the zero order optical mode (FIG. 4B).

On the other hand, the electric current density distribution (FIG. 3A) of the first active layer 204 which is close to the oxidized constriction layer is weekly coupled with the zero order optical mode, and undesirably results in being strongly coupled with the first-order optical mode (FIG. 4A).

From the above described computation result, it is understood that the surface emitting laser may be structured in the following way so as to increase, for instance, a single mode output in a zero order mode.

That is to set relatively larger a contribution to a mode gain of the second active layer which has a convex shape of electric current density distribution and is distant from the oxidized constriction layer than that of the first active layer which is close to the oxidized constriction layer. For instance, number of wells in the second active layer located distant from the oxidized constriction layer may be set larger than that in the first active layer located close to the oxidized constriction layer.

On the contrary, it is understood that the surface emitting laser may be structured in the following way so as to increase a single mode output in the first-order mode.

Specifically, the number of the wells in the active layer that is close to the oxidized constriction layer and has a concave shape of electric current density distribution, which has a high coupling coefficient with the first-order optical mode, may be set larger than the number of the wells in the active layer that is more distant from the oxidized constriction layer than the above active layer.

Thus, the surface emitting laser was found which had a current constriction structure and a plurality of active layers, and had desired characteristics, by providing a structure therein having the plurality of the different active layers according to an electric current density distribution produced by the current constriction.

A surface emitting laser having the periodic gain structure in the above described conventional example is structured so that the active layers having the same structure are arranged as in Japanese Patent Application Laid-Open 2001-94209 (FIGS. 2A and 2B in the 8th page).

In this structure, only laser characteristics (mainly, light output) are enhanced by the maximal enhancement of the coupling efficiency of the light distribution in an emitting (vertical) direction with the active layer, in other words, so-called a confinement factor. Accordingly, the surface emitting laser of the conventional example in which the active layers having the same structure are arranged cannot control the characteristics, for instance, of increasing the single mode output in the zero order mode or increasing the single mode output in the first-order mode, so as to be desired.

On the contrary, the surface emitting laser according to the present invention can acquire the optimum structure in which the electric current density distribution in the in-plane direction produced by the oxidized constriction structure, in other words, an effective active region in the in-plane direction and the light distribution are considered, by providing a structure therein having a plurality of different active layers according to the electric current density distribution to be produced by the current constriction.

Examples according to the present invention will be described below.

Example 1

In Example 1, a structure of a surface emitting laser which obtains a single mode operation in a zero order optical mode will be described below with reference to FIGS. 1A and 1B.

Figure 1A:
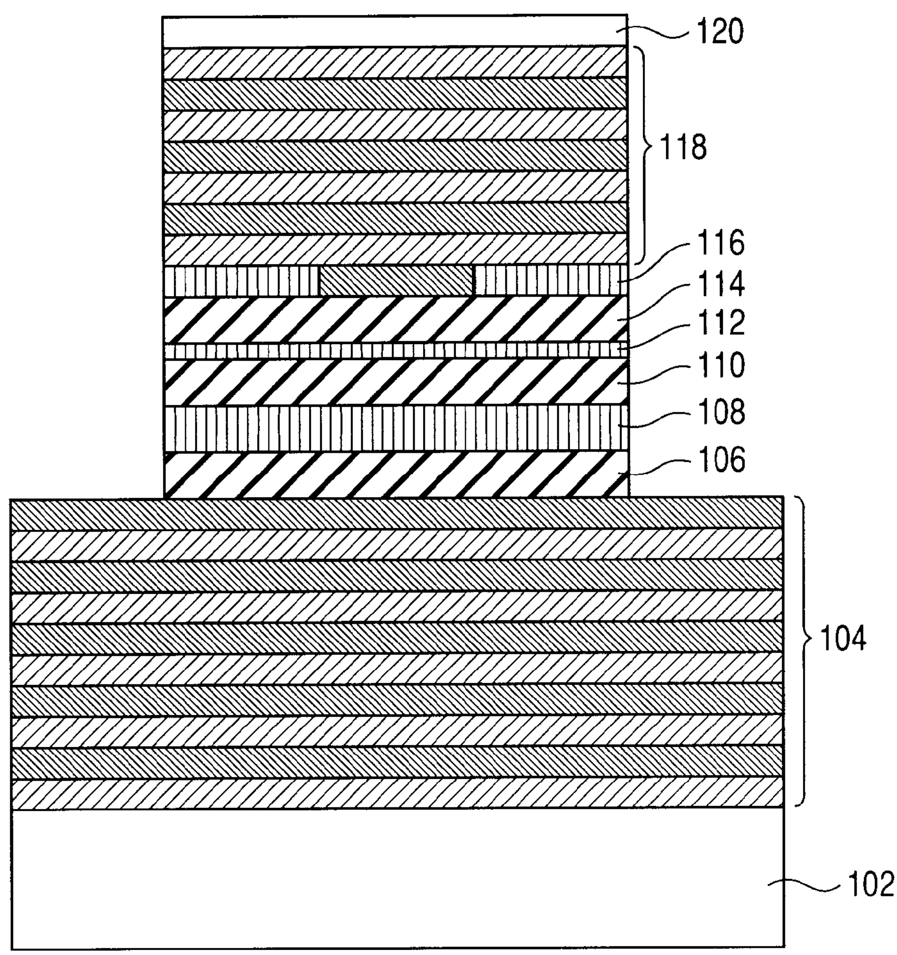
FIG. 1A is a view for describing a structure of a surface emitting laser in Example 1 of the present invention.

FIG. 1A illustrates a specific structure which is applied to a red surface emitting laser that oscillates at 680 nm. An n-AlAs/AlGaAs multilayer film reflection mirror 104 exists on an n-GaAs substrate 102, which is a lower semiconductor multilayer film reflection mirror (a second semiconductor multilayer film reflection mirror).

An n-AlGaInP spacer layer 106 and a GaInP/AlGaInP quadruple quantum well 108 (a second active layer) exist thereon.

Then, a p-AlGaInP middle spacer layer 110, a GaInP/AlGaInP single quantum well 112 (a first active layer) and a p-AlGaInP spacer layer 114 exist thereon.

Furthermore, a p-AlGaAs/AlGaAs multilayer film reflection mirror 118 exists thereon, which is an upper semiconductor multilayer film reflection mirror (a first semiconductor multilayer film reflection mirror), and one part thereof becomes an AlGaAs oxidized constriction layer 116.

Finally, a p-GaAs contact layer 120 is the termination. In FIG. 1A, an electrode necessary for operating a device and an insulating film between layers are not described for simplification, but actually need to be formed.

A 10° off substrate is often used for the n-GaAs substrate 102 in consideration of a doping efficiency for AlGaInP which is a quaternary material and an influence of a natural superlattice. A 5 to 15° off substrate may also be used as needed.

Each layer of the n-AlAs/$Al_{0.5}Ga_{0.5}As$ multilayer film reflection mirror 104 has a film thickness corresponding to the optical thickness of ¼ of the wavelength of 680 nm which is a resonance wavelength, so as to obtain appropriate reflection characteristics. The number of pairs is 60 pairs.

In order to provide adequate electrical conductivity, a composition gradient layer having 10 to 20 nm thickness may also be used so as to reduce an influence of a barrier on a hetero interface between AlAs and AlGaAs as much as possible.

In order to obtain an n-type electroconductivity, Si, Ge, Se and the like are used as a dopant, and the impurity concentration is controlled so as to be $5\times10^{17}$ to $5\times10^{18}$ $cm^{-2}$. In this example, AlAs was used for a low refractive index layer, in order that reducing the heat resistance of the multilayer film reflection mirror is taken precedence. However, AlAs has also a problem of being easily oxidized in an oxidization constriction process.

For this reason, $Al_{0.9}Ga_{0.1}As$ which is more difficult to be oxidized may also be employed instead of AlAs, in several pairs in the upper part of this multilayer film reflection mirror, in other words, in a region which is close to the active layer.

The p-$Al_{0.9}Ga_{0.1}As$/$Al_{0.5}Ga_{0.5}As$ multilayer film reflection mirror 118 also has a film thickness corresponding to the optical thickness of ¼ of the wavelength similarly to that in the reflection mirror 104. The number of pairs is 34 pairs. In consideration of electrical properties, a composition gradient layer may also be used.

In order to obtain a p-type electroconductivity, C, Zn, Mg and the like are used as a dopant. The impurity concentration is controlled so as to be $5\times10^{17}$ to $5\times10^{18}$ $cm^{-2}$. An AlGaAs oxidized constriction layer 116 has a composition of 98% Al, and has the layer thickness of 30 nm. The oxidation layer is selectively oxidized from the oxidized layer end face of the wall in a mesa side, by being heated to 400° C. in a water vapor atmosphere. Then, AlGaAs is denatured to an oxide such as AlO and is converted into an insulating layer.

The oxidization distance is controlled with time so that the diameter of the aperture part which has been left there without being selectively oxidized can be 6 μm. Because the aperture part which has not been oxidized remains as AlGaAs and keeps its electrical conductivity, the electric current can be constricted there. In order to obtain the p-type electroconductivity in the aperture part in this layer as well, the AlGaAs oxidized constriction layer is doped with C, Zn, Mg and the like so as to be $5\times10^{17}$ to $5\times10^{18}$ $cm^{-2}$. The composition gradient layer may also be provided as needed.

Each spacer layer in the resonator which is sandwiched between upper and lower multilayer film reflection mirrors 104 and 118 employs AlGaInP which is a quaternary material.

The $Al_{0.35}Ga_{0.15}In_{0.5}P$ layer is used for the p-side spacer layer 114. In order to reduce the overflow of electrons as much as possible, $Al_{0.5}In_{0.5}P$ of which the band gap becomes maximal may also be used.

Mg, Zn or the like is used as a dopant and the impurity concentration is controlled so as to be $7\times10^{17}$ to $2\times10^{18}$ $cm^{-2}$.

The n-side spacer layer 106 employs $Al_{0.35}Ga_{0.15}In_{0.5}P$. Si, Se and the like are used as a dopant, and the impurity concentration is controlled so as to be $1\times10^{17}$ to $1\times10^{18}$ $cm^{-2}$. The middle spacer layer 110 is doped with Mg, Zn or the like so as to have p-type electroconductivity here and have $1\times10^{17}$ to $1\times10^{18}$ $cm^{-2}$ of the impurity concentration.

Mg may unintentionally lead to doping to an active layer formed on this middle spacer layer, due to the influence of memory effect, so the middle spacer layer may be undoped as needed.

Figure 1B:
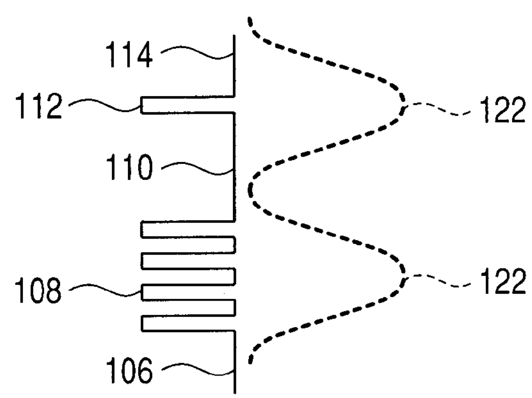
FIG. 1B is a view illustrating energy levels of conduction bands in the periphery of active layers in the surface emitting laser in FIG. 1A.

The layer thicknesses of these three spacer layers are each adjusted so that the active layers 108 and 112 can be arranged respectively in antinodes 122 of light density distribution as is illustrated in FIG. 1B, and the optical thickness of the resonator between the multilayer film reflection mirrors can be integer times of $\lambda/2$.

In order to obtain a p-side contact of a low resistance, a p-GaAs contact layer 120 of 20 nm is provided as the top surface layer, which is doped with C, Zn or the like up to $1\times10^{19}$ to $1\times10^{20}$ $cm^{-2}$. A $GaInP/Al_{0.25}Ga_{0.25}In_{0.5}P$ single quantum well 112 and a $GaInP/Al_{0.25}Ga_{0.25}In_{0.5}P$ quadruple quantum well 108 are provided as two active layers. The peak of light to be emitted of any of active layers is set at 660 nm which is shorter than 680 nm of the resonance wavelength.

Specifically, in this example, the In compositions and well widths of the GaInP well layers are set at the same values. Thus, the peak wavelength of light to be emitted is set at a shorter value than the resonance wavelength to provide a detuning amount. Thereby, a device having more excellent temperature characteristics can be formed.

From the computation result of FIG. 3, in order to increase a single mode output in a zero order mode, the contribution to a mode gain from a second active layer which is distant from the oxidized constriction layer having a more convex shape of electric current density distribution may be controlled so as to be relatively larger than that of the first active layer which is close to the oxidized constriction layer.

For this purpose, the volume of the first active layer may be reduced compared to the volume of the second active layer, for instance.

By doing so, the coupling efficiency (confinement factor) in a vertical direction changes. Specifically, the confinement factor of the first active layer decreases, in other words, the mode gain decreases.

On the other hand, the confinement factor of the second active layer increases, in other words, the mode gain increases. As a result, the zero order optical mode oscillation becomes a state of being more easily obtained.

Here, the single quantum well 112 of which the confinement factor is small is used for an active layer which is close to the oxidized constriction layer, and the quadruple quantum well 108 of which the confinement factor is large is used for an active layer which is distant from the oxidized constriction layer. FIG. 1B illustrates the detail drawing of the periphery of the active layer.

This figure illustrates an energy level of the conduction band, and the right direction indicates a high energy side. The vertical direction indicates a position of each layer, the lower side is a substrate side and the direction, which correspond to that in FIG. 1A.

The number of wells in the active layer which is distant from the oxidized constriction layer (corresponding to 108 of FIGS. 1A and 1B) is fixed at 4 as one example showing an effect of a structure having a plurality of active layers in which the numbers of wells in the semiconductor quantum well structure are different from each other, as described above.

At the same time, the number of wells in the active layer which is close to the oxidized constriction layer (corresponding to 112 of FIGS. 1A and 1B) is changed from 4 (sample 1: conventional example of FIGS. 2A and 2B) to 2 (sample 2) and 1 (sample 3).

Figure 5A:
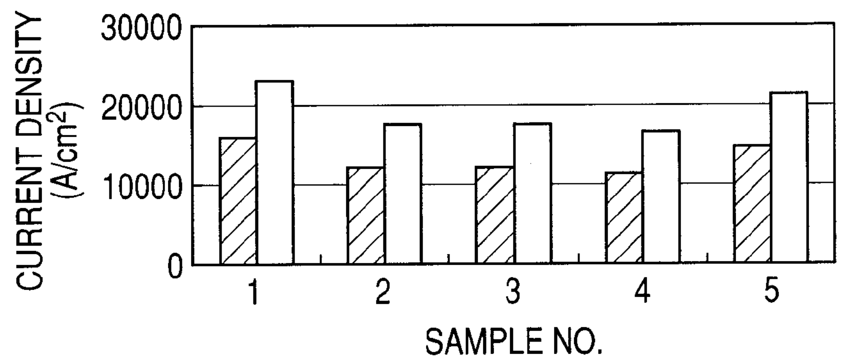
FIG. 5A and FIG. 5B are views illustrating values of electric current density in the central part and in an end part in the in-plane direction of active layers in the cases of various active layer structures in Example 1 of the present invention.
Figure 5B:
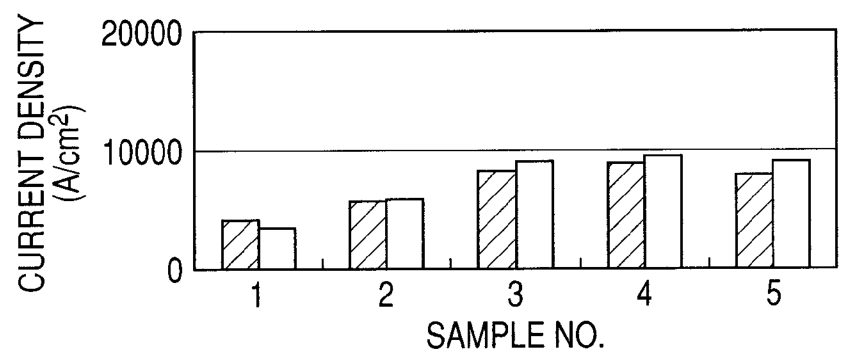

FIG. 5A and FIG. 5B illustrate a value in the center (black bar on the left side) of the aperture part of the oxidized constriction layer and a value in the end part (3 μm from the center: white bar on the right side) thereof, of the in-plane electric current density distribution, at this time.

FIG. 5A illustrates an electric current density in the first active layer which is close to the oxidized constriction layer, and FIG. 5B illustrates an electric current density in the second active layer which is distant from the oxidized constriction layer.

As is understood from FIGS. 5A and 5B, by changing the number of wells, the allocation of the electric current to each of the active layers can be controlled and the amount of the electric current to be injected into the active layer having a desired in-plane electric current density can be increased.

Figure 6:
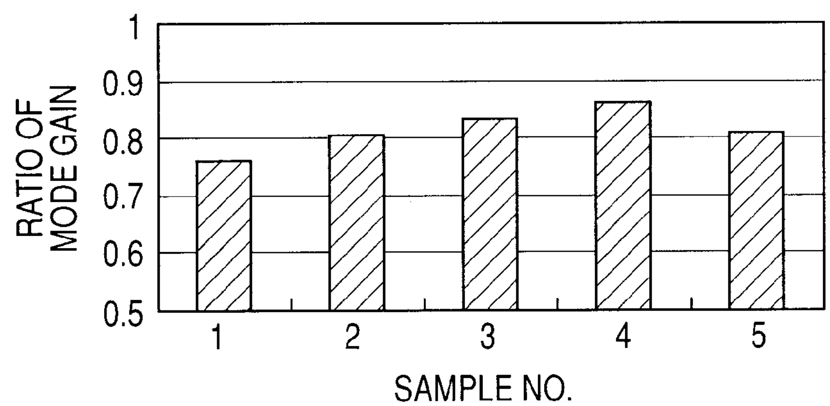
FIG. 6 is a view illustrating ratios of values of an in-plane mode gain in the central part and the end part in the cases of various active layer structures in Example 1 of the present invention.

Furthermore, in order to see a more direct effect to laser characteristics, the effect is illustrated in FIG. 6.

This FIG. 6 illustrates a ratio of a value in the center to a value in the end part of the aperture part of a mode gain (where the confinement factor is considered), which can be computed from the total of electric current density distributions in two active layers of FIG. 5A and FIG. 5B.

As this ratio is larger, the laser characteristics are more suitable for the single mode oscillation in the zero order optical mode.

From this FIG. 6 as well, it is understood that by relatively reducing the number of wells in the first active layer which is close to the oxidized constriction layer compared to that in the second active layer which is distant from the oxidized constriction layer, the ratio increases, specifically, the mode gain distribution in the in-plane direction having a more convex shape is achieved, and the single mode oscillation in the zero order optical mode tends to be easily obtained.

The point of the present example is to decrease the number of wells in the active layer which is close to the oxidized constriction layer and has a concave shape of electric current density distribution, and to increase the number of wells in the active layer which is distant from the oxidized constriction layer and has a convex shape of electric current density distribution.

In addition to the above described example, for instance, it is important to set the number of wells in the active layer which is close to the oxidized constriction layer at 1 to 3 and the number of wells of the active layer which is distant from the oxidized constriction layer at 3 to 5, and to set the confinement factor of the active layer which is distant from the oxidized constriction layer at a relatively large value.

Thus, by intentionally setting the numbers of wells so as to be different from each other, it can be achieved to increase the contribution of the gain obtained from the active layer having a more desirable in-plane electric current density distribution and increase the light output in a desired light mode.

In order to change the confinement factor, the effective volume of the active layer may be changed.

Here, because the quantum well active layer was used, the number of wells was changed. However, other methods may be also used, for instance, the effective volume of the active layer may be changed by changing one of well width and barrier width.

In other words, if the surface emitting laser is aimed at a single mode operation in a zero order optical mode, the well width of the second active layer which is distant from the oxidized constriction layer may be widened or the barrier width thereof may be narrowed compared to that of the first active layer.

It is also effective to positively control the amount of the electric current to be injected into each of the active layers so as to further control the contribution to the mode gain.

Specifically, the middle spacer layer is intentionally doped.

The cases are also illustrated in FIG. 5A, FIG. 5B and FIG. 6, in which the middle spacer layer is doped to be a p type (sample 4: case in Example 1 as illustrated in FIG. 1) or is doped to be an n type (sample 5), in the case of the above described sample 3.

Mg and Si are doped in both samples, each in amounts of $5\times10^{17}$ $cm^{-3}$.

As these figures illustrate, in this example, a mode gain distribution can become a more convex shape by converting the middle spacer layer into the p type by doping, or alternatively the mode gain distribution can become a more concave shape by converting the middle spacer layer into the n type by doping.

The reason is considered to be because when a p layer or an n layer is newly provided in an i-layer originally existing in the pn junction, another pn junction is preferentially formed in between the newly provided doped layer and a layer which has been doped to have a reverse polarity to the doped layer. And thereby, the injection of an electric current into the active layer existing therebetween can be further emphasized.

As is described above, the mode gain distribution in the in-plane direction can be controlled to a more desirable shape by doping the middle spacer layer appropriately.

Example 2

In Example 2, a structure of a surface emitting laser for obtaining a single mode operation in a first-order mode will be described below with reference to FIG. 7A and FIG. 7B.

Figure 7A:
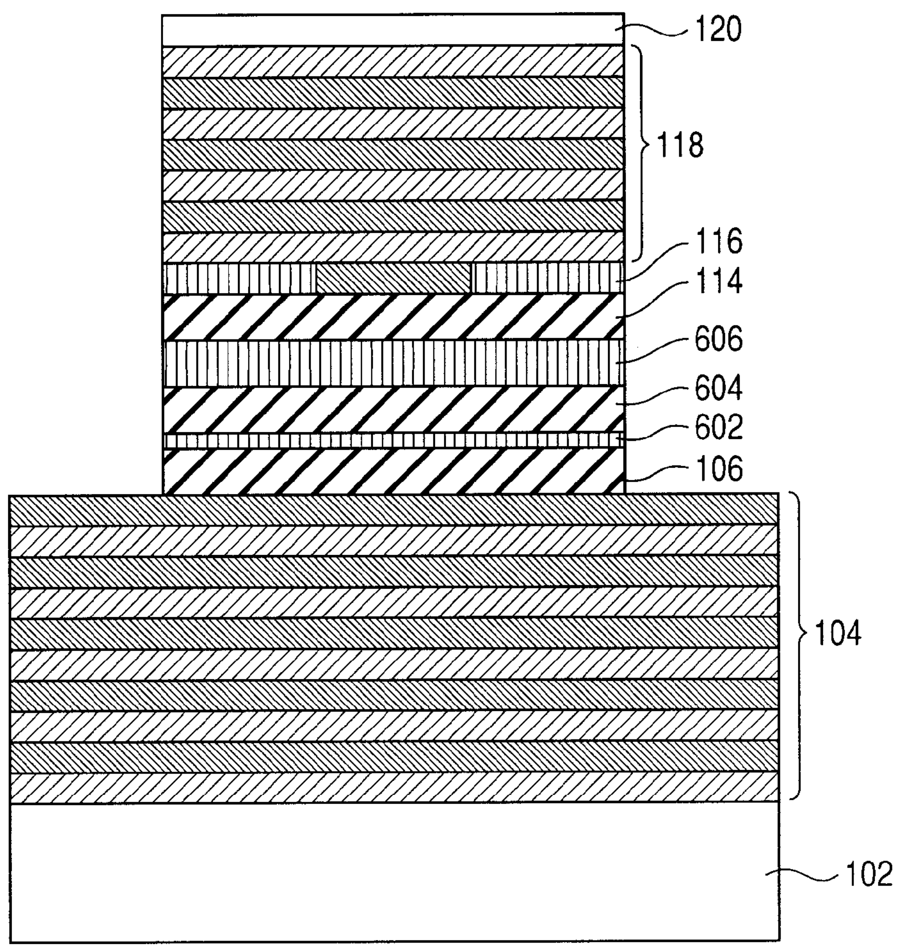
FIG. 7A is a view for describing a structure of a surface emitting laser in Example 2 of the present invention.
Figure 7B:
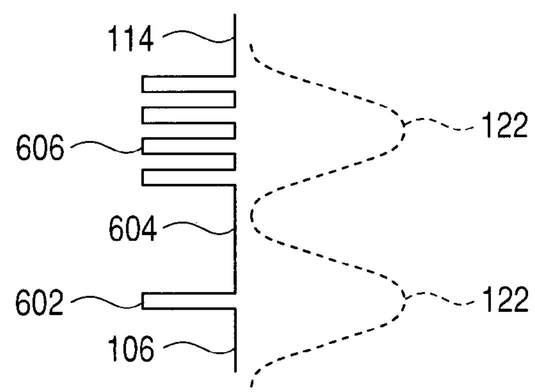
FIG. 7B is a view illustrating energy levels of conduction bands in the periphery of active layers in the surface emitting laser in FIG. 7A.

FIG. 7A and FIG. 7B illustrate a specific structure which was applied to a red surface emitting laser that oscillates at 680 nm.

Here, the structure will be described mainly on points which are different from that in FIG. 1A and FIG. 1B in Example 1. In Example 1, the purpose was a single mode operation in the zero order mode, but the present example is aimed at obtaining a single mode operation in the first-order optical mode and the plan is reverse to that of Example 1.

Specifically, as is illustrated in FIG. 7B, the active layer which is close to the oxidized constriction layer is formed to be a GaInP/AlGaInP quadruple quantum well 606 (the first active layer), and the active layer which is distant from the oxidized constriction layer is formed to be a single quantum well 602 (the second active layer).

Thereby, the confinement factor is positively increased by increasing the number of wells in the active layer that is close to the oxidized constriction layer and has a concave shape of electric current density distribution, which has a high coupling coefficient with the first-order optical mode.

Furthermore, by doping the middle spacer layer 604 so as to be n type, the concave shape of electric current density distribution is more emphasized, and a single mode operation in a first-order mode is enabled.

Here, an example was shown in which the number of wells was changed. However, a concept of changing the structure of each of the active layers is the same as in the case shown in Example 1, and it is important to use a structure of setting the contribution from the active layer having a desired in-plane electric current density distribution larger.

Example 3

In Example 3, a structure of a surface emitting laser which has a single mode operation in a zero order optical mode and further is highly efficient in all driving electric current regions will be described below with reference to FIG. 8A and FIG. 8B. When a device temperature rises by the injection of an electric current, a resonance wavelength and a peak wavelength of a light to be emitted generally is shifted to a long wavelength side.

At this time, the shifted amount of the resonance wavelength is approximately 0.05 nm/° C. whereas the shifted amount of the peak wavelength of the light to be emitted is as larger as approximately 0.3 nm/° C. Therefore, when the device temperature or the environment temperature rises, both of the wavelengths relatively deviate from each other, and the peak wavelength of the light to be emitted no longer matches with the resonance wavelength.

As a result, the gain is decreased, and the oscillation characteristics are degraded. Hence, normally, the peak wavelength of the light to be emitted is shifted (detuning) to a shorter wavelength side than the resonance wavelength by approximately 10 to 20 nm beforehand. Thereby, the surface emitting laser copes with the shift of the peak wavelength of the light to be emitted due to a high environment temperature and a temperature rise when a high electric current has been injected.

However, this means, on the other hand, that a threshold value increases when the environment temperature is low and the electric current is less injected, and that the efficiency decreases.

The present invention can achieve a more highly efficient device in wider driving electric current regions.

Figure 8A:
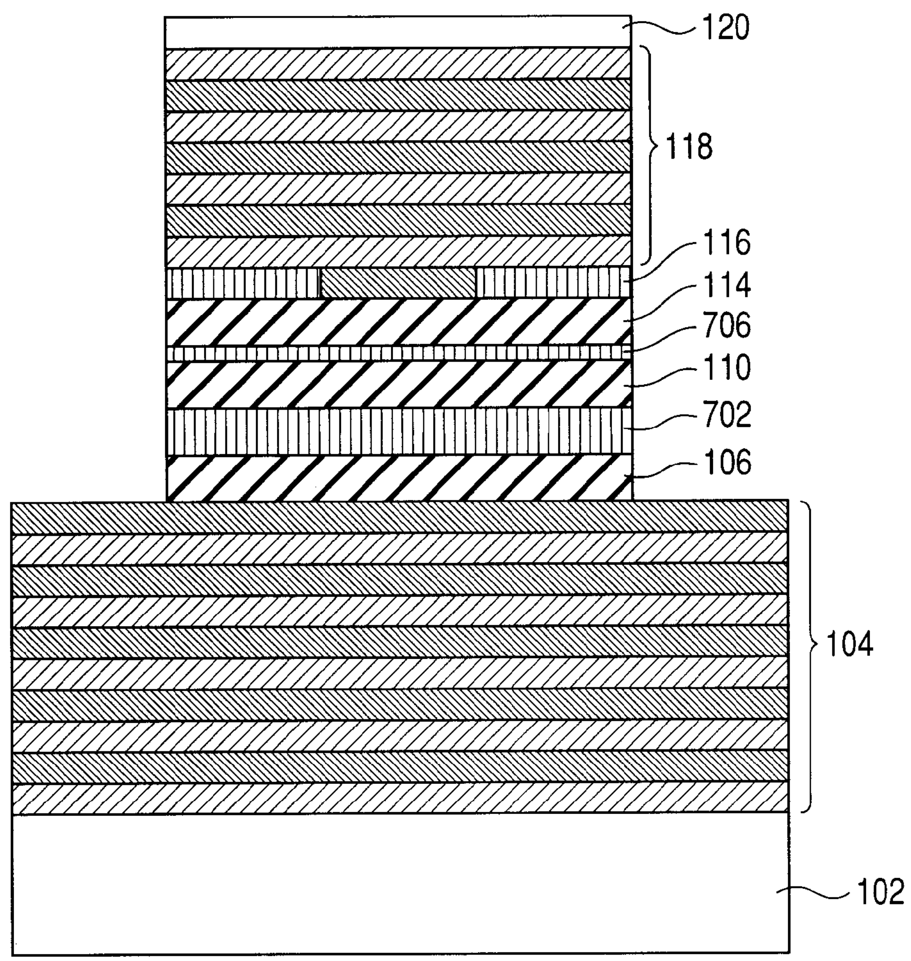
FIG. 8A is a view for describing a structure of a surface emitting laser in Example 3 of the present invention.
Figure 8B:
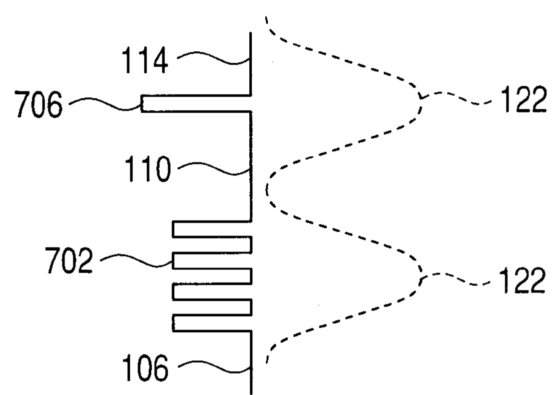
FIG. 8B is a view illustrating energy levels of conduction bands in the periphery of active layers in the surface emitting laser in FIG. 8A.

FIG. 8A and FIG. 8B illustrate a specific structure which was applied to a red surface emitting laser that oscillates at 680 nm.

Here, points which are different from FIG. 1A and FIG. 1B will be described.

As is illustrated in FIG. 8B, a first active layer which is close to an oxidized constriction layer is formed to be a GaInP/$Al_{0.25}Ga_{0.25}In_{0.5}P$ single quantum well 706, and a second active layer which is distant from the oxidized constriction layer is formed to be a GaInP/$Al_{0.25}Ga_{0.25}In_{0.5}P$ quadruple quantum well 702. Here, the In composition of GaInP which is a well layer is adjusted.

Thereby, the peak wavelength of the light to be emitted from the GaInP/$Al_{0.25}Ga_{0.25}In_{0.5}P$ single quantum well 706 is set at 675 nm, and the peak wavelength of the light to be emitted from the GaInP/$Al_{0.25}Ga_{0.25}In_{0.5}P$ quadruple quantum well 702 is set at 655 nm.

Specifically, in order to set the single quantum well 706 (the first active layer) at 675 nm, the In composition is increased to narrow the band gap.

In addition, in order to achieve 655 nm of the quadruple quantum well 702 (the second active layer), the In composition is decreased a little to widen the band gap.

Because the resonance wavelength is 680 nm, a detuning amount becomes 5 nm in the single quantum well 706, and becomes 25 nm in the quadruple quantum well. The middle spacer layer is undoped in the present Example.

The operation when an electric current has been injected into this device will be described below. The amount of the electric current to be injected is small right after the threshold value, so the self-heating is little, and the temperature rise is little.

In this situation, because the wavelength shift of the peak wavelength of the light to be emitted is small, the light emitted from the single quantum well 706 having 675 nm of the peak wavelength of the light to be emitted matches with 680 nm of the resonance wavelength, and its contribution becomes dominant.

In this case, although the electric current density distribution shows a concave shape, the diffraction loss in the first-order optical mode is originally larger than that in the zero order optical mode, in a low-current injection region right after the threshold value, so even if the electric current density distribution is a concave shape, the single mode operation is achieved.

On the other hand, when the electric current is further injected and reaches approximately several mA (several tens $kA/cm^2$ in current density), the temperature rise due to the self-heating greatly shifts the peak of the wavelength of the light to be emitted to a long wavelength side.

In such a case, the light emitted from the quadruple quantum well 702 which originally has the peak of the emitted light at 655 nm starts to match better with the resonance wavelength, and its contribution becomes large.

In this active layer, the in-plane directional electric current density has a convex shape of distribution, so even when the amount of the electric current to be injected has increased, the single mode operation in the zero order mode is subsequently possible. Besides, a detuning amount is set so as to match with the resonance wavelength when the temperature in a high-current injection region has risen, so the efficiency decreases little.

By thus providing an active layer structure having such a plurality of the detuning amounts as to match with each temperature rise according to a broad range of the amounts of the electric current to be injected, a surface emitting laser having high efficiency in all current regions can be obtained.

Here, as for detuning amounts, a small detuning amount for a low current region was set at 5 nm, and a detuning amount for a high-current region was set at 25 nm, but the detuning amount may be set so as to correspond to a heating value based on the injected electric current.

Specifically, it is effective to set the detuning amount at 0 to 10 nm for a small detuning amount, and set the detuning amount at 20 to 30 nm for a large detuning amount.

In the present example, as a method of changing the wavelength, the In composition was changed, but the wavelength may be controlled by the variation of the well width.

In this case, the confinement factor also varies according to the well width, so a desired value may be adjusted by variation including the number of wells.

In the above described cases, the number of the active layers was two, but the same method of thinking can be extended in the case as well in which the number is three or more. That is, as was described above, the active layer structure may be changed so as to enhance desired device characteristics, by positively using the difference of the in-plane directional current density distribution between the active layer which is close to the current constriction layer and the active layer which is distant from the current constriction layer.

In addition, the red surface emitting laser using the AlGaInP active layer was described in the above described examples, but the method of thinking in the present invention can be applied without depending on the wavelength and the material of the semiconductor layer. For instance, the method of thinking in the present invention can be also applied to a surface emitting laser having an active layer of one of InGaAsP, InGaAs and AlGaAs which emits a light of a longer wavelength side, and a surface emitting laser having an active layer of one of ZnCdSe, InGaN and AlGaN which emits a light of a shorter wavelength side.

In addition, only the case of the single device was described in the above described examples, but the surface emitting laser has an advantage in comparatively easily two-dimensionally arraying the single devices, which shows a large effect on application.

Accordingly, the device according to the present invention can be further effectively used by being two-dimensionally arrayed to form a multi-channel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-175352, filed Jul. 28, 2009, which is hereby incorporated by reference herein in its entirety.

The invention claimed is:

1. A surface emitting laser comprising:

a first semiconductor multilayer film reflection mirror;

a second semiconductor multilayer film reflection mirror which is arranged so as to oppose the first semiconductor multilayer film reflection mirror;

a gain region which is provided between the first semiconductor multilayer film reflection mirror and the second semiconductor multilayer film reflection mirror and has at least a first active layer and a second active layer;

a current constriction layer for constricting an electric current which is injected into the first active layer and the second active layer; and a spacer layer formed of a semiconductor layer being provided between the first active layer and the second active layer, wherein the first active layer has a smaller volume than the second active layer, and is arranged in a position which is closer to the current constriction layer than the second active layer.

2. The surface emitting laser according to claim 1, wherein the first active layer and the second active layer have a semiconductor quantum well structure, and the first active layer has fewer of the wells than the second active layer.

3. The surface emitting laser according to claim 1, wherein the first active layer and the second active layer have a semiconductor quantum well structure, and the first active layer has a narrower width of the well than the second active layer.

4. The surface emitting laser according to claim 1, wherein the first active layer and the second active layer have a semiconductor quantum well structure, and the first active layer has a wider width of the barrier than the second active layer.

5. The surface emitting laser according to claim 1, wherein the first active layer and the second active layer include a semiconductor layer, the semiconductor layer is formed of AlGaInP, and the first active layer contains more In composition than the second active layer.

* * * * *